United States Patent [19]

Rostoker et al.

[11] Patent Number: 5,635,424
[45] Date of Patent: Jun. 3, 1997

[54] HIGH-DENSITY BOND PAD LAYOUT ARRANGEMENTS FOR SEMICONDUCTOR DIES, AND CONNECTING TO THE BOND PADS

[75] Inventors: Michael D. Rostoker; Dorothy A. Heim, both of San Jose, Calif.

[73] Assignee: LSI Logic Corporation, Milpitas, Calif.

[21] Appl. No.: 430,399

[22] Filed: Apr. 28, 1995

Related U.S. Application Data

[62] Division of Ser. No. 251,058, May 31, 1994, Pat. No. 5,441,917, which is a division of Ser. No. 995,644, Dec. 18, 1992, Pat. No. 5,404,047, which is a continuation-in-part of Ser. No. 935,449, Aug. 25, 1992, Pat. No. 5,300,815, which is a continuation-in-part of Ser. No. 916,328, Jul. 17, 1992, Pat. No. 5,340,772, and a continuation-in-part of Ser. No. 947,854, Sep. 18, 1992, Pat. No. 5,248,903.

[51] Int. Cl.$^6$ ................................................. H01L 21/41
[52] U.S. Cl. ...................... 438/612; 437/183; 437/204; 437/209; 364/491; 438/106
[58] Field of Search ........................ 437/204, 207, 437/208, 195, 183, 209, 220, 182

[56] References Cited

U.S. PATENT DOCUMENTS 5,454,905  10/1995  Fogelson ............................. 437/220

FOREIGN PATENT DOCUMENTS

| 0095642 | 6/1982 | Japan | 437/204 |
|---|---|---|---|
| 1-107549 | 4/1989 | Japan . | |
| 0199523 | 7/1992 | Japan | 437/204 |

Primary Examiner—Tuan H. Nguyen
Attorney, Agent, or Firm—Katz & Cotton, LLP

[57] ABSTRACT

Composite bond pad structure and geometry increases bond pad density and reduces lift-off problems. Bond pad density is increased by laying out certain non-square bond pads which are shaped, sized and oriented such that each bond pad closely conforms to the shape of the contact footprint made therewith by a bond wire or lead frame lead and aligns to the approach angle of the conductive line to which it is connected. Alternating, interleaved, complementary wedge-shaped bond pads are discussed. Bond pad liftoff is reduced by providing an upper bond pad, a lower bond pad and an insulating component between the upper and lower bond pads. At least one opening is provided through the insulating component, extending from the bottom bond pad to the upper bond pad. The at least one opening is aligned with a peripheral region of the bottom bond pad and is filled with conductive material.

7 Claims, 12 Drawing Sheets

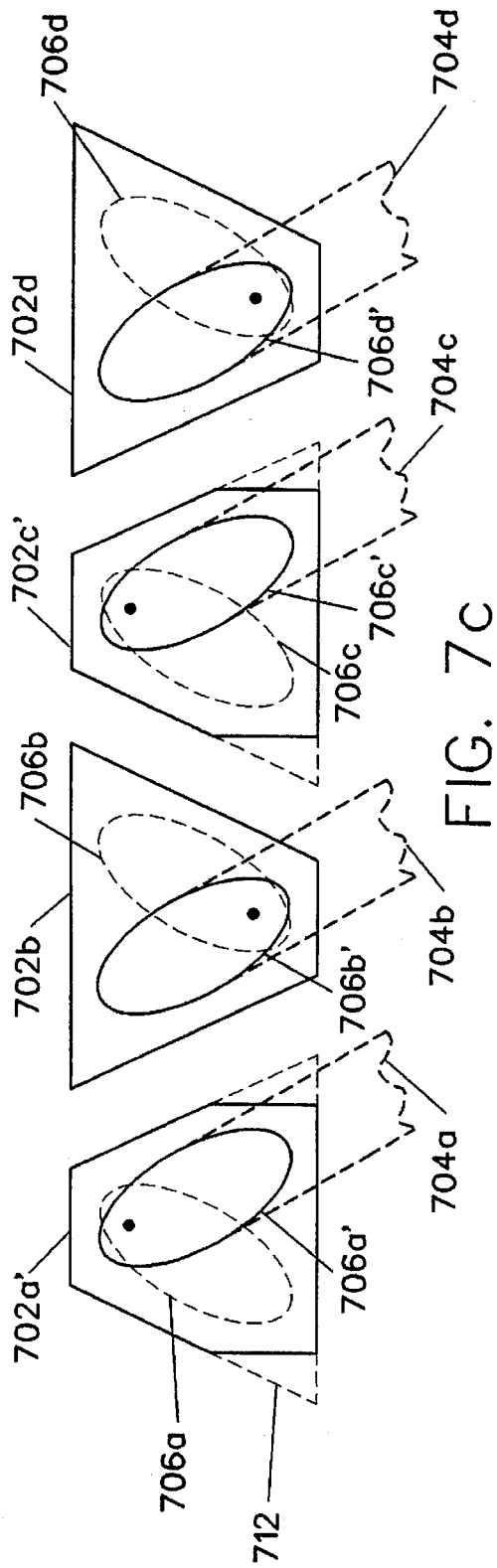
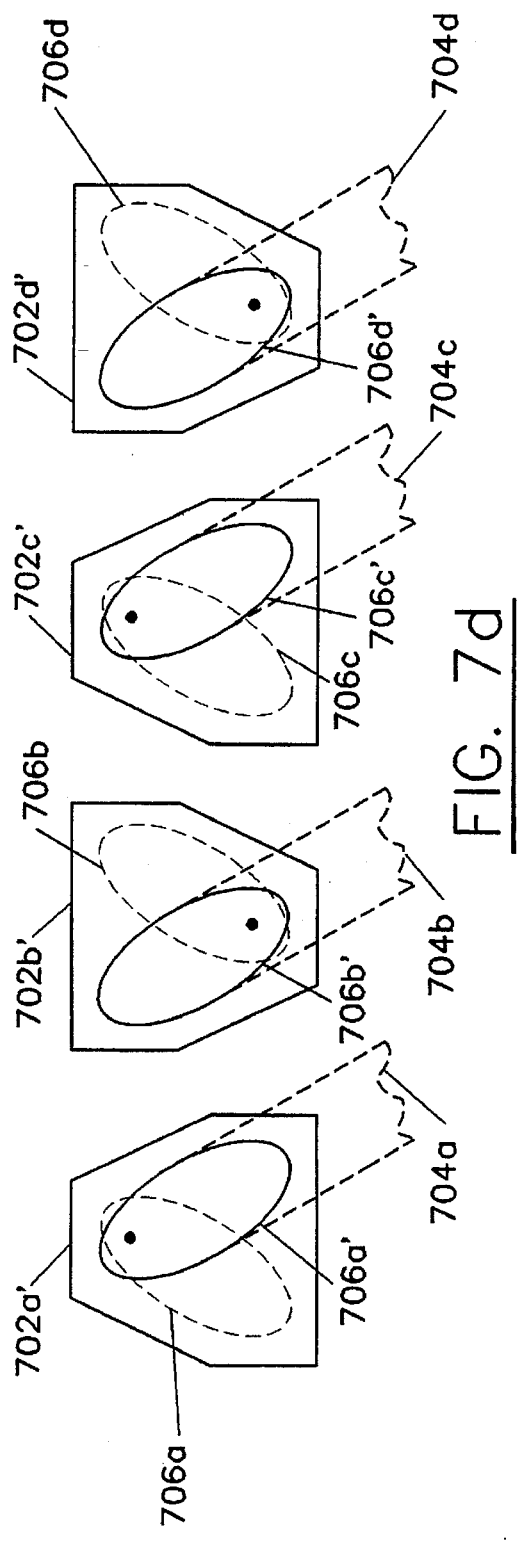

HIGH-DENSITY BOND PAD LAYOUT ARRANGEMENTS FOR SEMICONDUCTOR DIES, AND CONNECTING TO THE BOND PADS

CROSS-REFERENCE TO RELATED APPLICATIONS

This application is a divisional of commonly-owned U.S. patent application Ser. No. 08/251,058, filed May 31, 1994, now U.S. Pat. No. 5,441,917: which was a divisional of U.S. patent application Ser. No. 07/995,644, filed Dec. 18, 1992, now U.S. Pat. No. 5,404,047; which was a continuation-in-part of U.S. patent application Ser. No. 07/935,449, filed Aug. 25, 1992(now U.S. Pat. No. 5,300,815); which was a continuation-in-part of U.S. patent application Ser. No. 07/916,328, filed Jul. 17, 1992 (now U.S. Pat. No. 5,340,772) and U.S. patent application Ser. No. 07/947,854, filed Sep. 18, 1992 (now U.S. Pat. No. 5,248,903).

TECHNICAL FIELD OF THE INVENTION

The invention relates to making connections to integrated circuit (IC) devices (semiconductor dies), particularly to the design, layout, configuration and fabrication of bond pads on the die.

BACKGROUND OF THE INVENTION

Today's semiconductor technology has been advancing in a direction that requires ever increasing numbers of interconnections with integrated circuits. Typically a large number of integrated circuits are formed on a silicon wafer, then are sliced into individual integrated circuit dies (or chips). Each die is then packaged and used.

Electrical connections to the dies are made in one of a few ways. In one type of package, a die-receiving area (or die receiving cavity) is provided in the package to receive an integrated circuit die. A number of conductive lines (traces or leads) whose outer ends are electrically connected to pins or leads on the package extend inward towards the die and receiving area, usually in a radial pattern, stopping just short of the periphery of the die. The die has a number of "bond pads" for the purpose of making electrical connections with the inner ends of the conductive lines, and is mounted such that the bond pads are exposed. The inner ends of these conductive traces or leads are disposed such that they form an array of connection points surrounding the die. Very thin "bond wires" (usually formed of aluminum or gold) are then used to connect the connections points on a one-for one basis with the bond pads on the integrated circuit die. Each bond wire has an "approach angle" to the die. After mounting, the area or cavity containing the die and the bond wires is usually sealed with a cover or an encapsulant to protect the die and the bond wires from ambient moisture or physical damage.

In another type of package, exemplified by Tape Automated Bonding (TAB) packaging, a lead frame is provided having a plurality of conductive leads (sometimes with a tape backing). The lead frame has a die-receiving area, where the semiconductor die is mounted. The leads typically approach and enter the die-receiving area in a radial pattern, with their inner ends extending within the periphery of the die. The die is provided with a pattern of "bond pads". The inner ends of the leads and/or the bond pads are typically provided with solder (or gold) bumps. The die is mounted such that the bond pads align with and make electrical contact with the inner ends of the leads. Evidently, in TAB, or other similar technique of connecting dies to leads (or traces), bond wires are not employed.

Often, an integrated circuit die may be used in one of several different packages. For example, the same die may be packaged in a plastic or ceramic DIP package (dual inline package), a leadless chip carrier (LCC), a plastic leaded chip carrier (PLCC), etc. While these packages all have a die-receiving area and conductive traces, the arrangement of conductive traces in the die-receiving area may be slightly different from one package to another. As a result, the approach angle of a bond wire (e.g.) extending to any given bond pad on the die from a corresponding conductive trace may vary somewhat from package to package.

As mentioned before, "conductive traces" are generally printed traces on a ceramic substrate or on a printed circuit board. "Conductive leads" are usually conductors in a lead-frame, such as in a TAB or plastic-molded package. For the purposes of this specification, the term "conductive lines" will be used hereinafter to refer collectively to conductive leads, conductive traces, and bond wires.

FIG. 1 shows a portion of a typical semiconductor device package 100 of the prior art. A die 106 is mounted in a die-receiving area 104. Around the periphery of the die-receiving area 104 is a raised surface 102 with a number of conductive traces 110.

These traces 110 are shown along only one side of the die, for illustrative clarity, but are usually disposed along all (four) sides of the die- receiving area 104. A series of square bond pads 108 are arranged along the edges of the die. Again, FIG. 1 shows bond pads along only one edge of the die for illustrative clarity, but bond pads are usually provided along all of the edges of the die, on the "top" (circuit element containing) surface of the die just within the edges of the die. Bond wires, e.g., 112a, 112b, 112c, 112d and 112e, connect respective conductive traces 110 (e.g., 110a, 110b, 110c, 110d and 110e) to respective bond pads 108 on a one-to-one basis. The conductive traces approach the die 106 in a generally radial pattern (fanned-out, or fanned-in pattern), such that the "approach angles" of conductive traces and bond wires closest to an end of die edge 118 (e.g., 110d, 112d, 110e, and 112e) are the furthest off-perpendicular, while the approach angles of conductive traces and bond wires nearest the center (midpoint) of the die edge 118 (e.g. 110a and 112a) are substantially perpendicular to the edge 118, with the off-perpendicular component of approach angles generally increasing with the offset from the midpoint of the die edge. A centrally located conductive trace 110a and bond wire 108a approach the die such that their approach angle (as shown by dashed line 114) is substantially perpendicular to the edge 118 of die 106. Another conductive trace 110b and bond wire 112b, located three traces (and bond wires) away from the centrally located conductive trace 110a (and bond wire 112a), approaches the die 106 at an off-perpendicular angle $\phi_3$. Yet another conductive trace 110c and bond wire 112c, located nine traces (and bond wires) away from the centrally located conductive trace 110a(and bond wire 112a), approach the die at an off-perpendicular angle $\phi_9$(greater than $\phi_3$).

FIG. 2 shows a more detailed view of the die 106. A typical bond wire 112 is shown attached to a typical square bond pad 108. An inter-pad spacing of "d" is shown, between bond pads. The bond wire 112 enters the pad area at an approach angle $\Theta$. The contact area ("footprint") 220 formed by the bond wire 112 with the bond pad 108 is generally elliptical. This is typical of contact footprints between bond wires and bond pads which usually have an elongated shape, with the "elongated dimension" (or "major axis" of the shape, defined hereinbelow) substantially aligned with the approach angle ($\phi$).

Typically, prior art bond pads are square, as shown in FIGS. 1 and 2, and are capable of receiving bond wires over a wide range of approach angles, since a bond pad is typically much larger (e.g., in overall area) than the contact footprint formed by the bond wire (or, for example, by an analogous conductive lead in a TAB package).

As stated hereinabove, there is a great deal of pressure in modern integrated circuit technology to provide greater numbers of interconnections (I/O) to integrated circuit dies. This, of course, requires a commensurate increase in the number of bond pads disposed about the periphery of the die. As mentioned hereinabove, there is typically a required minimum inter-pad spacing "d" between adjacent pads to minimize the possibility of shorting or coupling between adjacent bond pads or bond wires (or conductive leads). And, it virtually goes without saying, that the size of bond pads cannot readily be reduced. However, there is a finite, limited amount of space (linear area) along the edges of an integrated circuit die for accommodating bond pads. This evidently limits the number of bond pads that can be arranged along the edges of the die. One approach to increasing the number of bond pads, and hence the number of connections that can be made to the die, is to provide multiple (e.g., two) rows of bond pads along the edges of the die, but this approach would require bond wires to cross over one another, creating a serious risk of a short circuit, even if the rows of bond pads were staggered. (Such a multiple row approach is somewhat inapposite for TAB.) This problem is especially poignant in cases where there is a wide range of approach angles to bond pads possible for different packages.

The present invention is also concerned with the formation (structure) of the bond pad itself, irrespective of the approach angle or I/O count (number of bond pads that fit along the edge of a die) situations discussed above.

Integrated circuit devices comprise a semiconductor die having a variety of diffusions and overlying layers forming circuit elements, gates and the like. Generally, the penultimate layers fabricated on the die are conductive metal layers ("M") having patterns of conductive lines. (These conductive lines are internal to the die, and should not be confused with the leads and traces discussed hereinabove, which are external to the die.) Two or more metal layers ("M1", "M2", etc.) are separated by a dielectric layer of inter-layer dielectric (ILD). For purposes of this discussion, it is assumed that there are two conductive layers, a layer designated "M1", and a layer designated "M2". An ILD layer overlies the M1 layer, and the M2 layer overlies the ILD. Typically, a topmost passivation layer is applied over the M2 layer. Openings through this passivation layer expose areas of the M2 layer. These exposed areas are termed "bond sites". The "bond pad", per se, is the bond site, and the underlying M2/ILD/M1 structure. Connections to the die, hence to the circuitry contained on the die, are effected with these exposed areas (i.e., bond pads). For example, bond wires may be bonded directly to the bond sites (pads), or solder or gold bumps may be formed on the bond sites for tape-automated bonding to the die, or gold balls may be formed on the exposed areas for flip-chipping the die to a substrate. This is all well known.

As mentioned above, the bond pad is ultimately bonded to, whether with a bond wire or the like (e.g., solder or gold bumps). These various processes typically impart mechanical and or thermal energy directly onto the bond pad, especially in the contact area. It has been observed that these bonding processes can cause the bond pad to delaminate (lift) from the underlying surfaces of multiple metal layers and oxide. This bond pad lift problem can happen in all different kinds of bonding technology, such as aluminum wire bond, gold ball bonding, gold bump bonding, and others. This bond pad lift problem can become exacerbated when there is layer of barrier metal, such as titanium (Ti), titanium nitride (TIN), Titanium-Tungsten (TiW), and the like, under the bond pads. Bond pad lift is very undesirable, and can result in potential problems in both assembly (packaging) yield and device reliability.

In the past, efforts to alleviate bond pad lift have been directed to: (1) adjusting bonding process parameters to minimize the thermal and/or mechanical shock to the bond pad; and (2) optimizing the barrier metal layer materials and deposition technology. These efforts have met with only partial success, and impose undesirable constraints (i.e., a narrow window of process parameters) on the bonding process.

DISCLOSURE OF THE INVENTION

It is therefore an object of the present invention to provide a technique for increasing the number of bond pads on an integrated circuit (semiconductor) die, especially on a semiconductor die having a given periphery.

It is another object of the present invention to provide bond pads which can accommodate a wide range of approach angles.

It is a further object of the present invention to provide a technique for increasing the number of bond pads on an integrated circuit die which can be accomplished in a single row of bond pads.

It is a further object of the present invention to provide an improved bond pad structure for semiconductor devices.

It is a further object of the present invention to reduce bond pad lift, without narrowing the window of bonding process parameters.

According to the invention, elongated or "certain non-square" composite bond pads, described hereinbelow, which conform closer to a contact footprint shape than do prior-art bond pads, permit closer center-to-center spacing of bond pads that do prior-art square bond pads, while maintaining comparable inter-pad spacing.

In one embodiment of the invention elongated bond pad shapes are defined which conform roughly to the shape of a contact footprint. Bond pads having this shape are then disposed along a side of an integrated circuit die and oriented such that they substantially align with the conductive lines to which they will be connected.

In another embodiment of the invention, the side of the die is a straight edge, and the bond pads are arranged to align with a radial or "fanned" pattern of conductive lines.

In another embodiment, the semiconductor die is further adapted to be mounted in a die receiving area of a substrate, such as a ceramic package, a printed circuit board, or a TAB package, and the bond pads are shaped and aligned to the approach angle and contact footprint of the conductive lines to be connected thereto.

In various embodiments, the conductive lines may be bond wires, conductive traces, or conductive leads.

In another embodiment, the bond pad shapes are defined by defining a contact footprint shape, choosing an elongated shape and sizing it such that it encloses the contact footprint shape. Another embodiment elaborates on this technique by providing a safety zone around the contact footprint shape to allow for errors in placement, approach angle, or variations in contact footprint shape. The elongated shape is then sized to enclose the safety zone.

Other embodiments provide for specific elongated shapes, including elongated rectangular shapes, parallelogram shapes, trapezoidal shapes, tapered shapes, and non-polygonal curved shapes (for example, elliptical, cardioid, trochoid, or "egg-shaped" curves).

In another embodiment of the invention, "certain non-square" bond pad shapes are defined by defining a pivot point in a contact footprint, defining a "swept contact area" by rotating (sweeping) the contact footprint through a range of angles, then shaping and sizing a polygonal or curved shape to closely conform to and enclose the swept contact area. Another embodiment adds to this technique by adding a safety zone around the swept contact area and additionally requiring that the bond pad further enclose the safety zone. Still another embodiment defines an "anchor point" within the bond pad shape according to the location of the pivot point in the swept contact area around which the bond pad shape was defined.

Often, "certain non-square" shapes will have a sort of "wedge" shape to them, particularly if the pivot point is defined off-center of the elongated contact footprint. It is also possible to move the pivot point to the other end of the contact footprint to generate complementary shapes. The possibility of complementary shapes suggests the possibility of arranging such shapes in an alternating interleaved linear array, providing the benefits of both higher bond pad density and a wide range of approach angles.

Other embodiments of the invention deal with arranging alternating interleaved arrays of bond pads along one or more edges of a semiconductor die.

Another embodiment of the invention provides for connecting bond wires to alternating interleaved arrays of bond pads by allowing for alternating locations of anchor points on bond pads and different pivot points (mounting reference points relative to the ends) on bond wires depending upon the bond pads to which they will be connected.

The observation can be made that the actual bond pad space used by a bond wire is the area covered by the contact footprint made by the bond wire with the bond pad. Allowing a safety zone outside of this space for variations in contact footprint from bond pad to bond pad, and for slight error in placement and approach angle, it can be seen that the minimum required area of a bond pad is only slightly larger than the contact footprint. Since the contact footprint is usually an elongated shape substantially aligned with the approach angle of the bond wire, a similarly shaped and oriented bond pad (elongated bond pad) may be used. This sort of bond pad requires significantly less space along an edge of a die than the bond pads of the prior art, and complementary angled shapes may be nested to take up even less space.

Further according to the invention, a composite bond pad includes an upper bond pad, a lower bond pad and an insulating component between the upper and lower bond pads. At least one opening is provided through the insulating component, extending from the bottom bond pad to the upper bond pad. This at least one opening is aligned with a peripheral region of the bottom bond pad. Conductive material fills the at least one opening, and electrically connects the top and bottom bond pads.

In one embodiment of the invention, the at least one opening is a plurality of vias. Each via may measure approximately one micron in cross-section. The vias may extend in at least one "string" (row) around the peripheral region of the lower bond pad. If there are two or more strings of vias, the vias of one string are preferably offset from the vias of another adjacent string.

In another embodiment of the invention, the at least one opening is a ring-like opening extending around the peripheral region.

In yet another embodiment of the invention, the at least one opening is one or more elongated slit-like openings. In the case of two of these elongated slit-like openings, they may be disposed across from one another vis-a-vis the area defined by the lower bond pad.

Other objects, features and advantages of the invention will become apparent in light of the following description thereof.

BRIEF DESCRIPTION OF THE DRAWING

FIGS. 7c and 7d are plan views of bond pads employing a technique for minimizing the risk of shorting and coupling between bond wires and adjacent bond pads, according to the present invention.

FIG. 8b is a plan view of the bond pad of FIG. 8a.

FIG. 9b is a top plan view of the bond pad of FIG. 9a.

DETAILED DESCRIPTION OF THE INVENTION

Bond Pad Shape

In general, the present invention makes use of elongated bond pads which generally conform to the shape of the elongated contact footprints made by bond wires (or by conductive leads) attached to the bond pads, taking into account slight errors in placement, variations in contact footprint, and variations in approach angle which may occur during the bonding process.

Figure 3A:
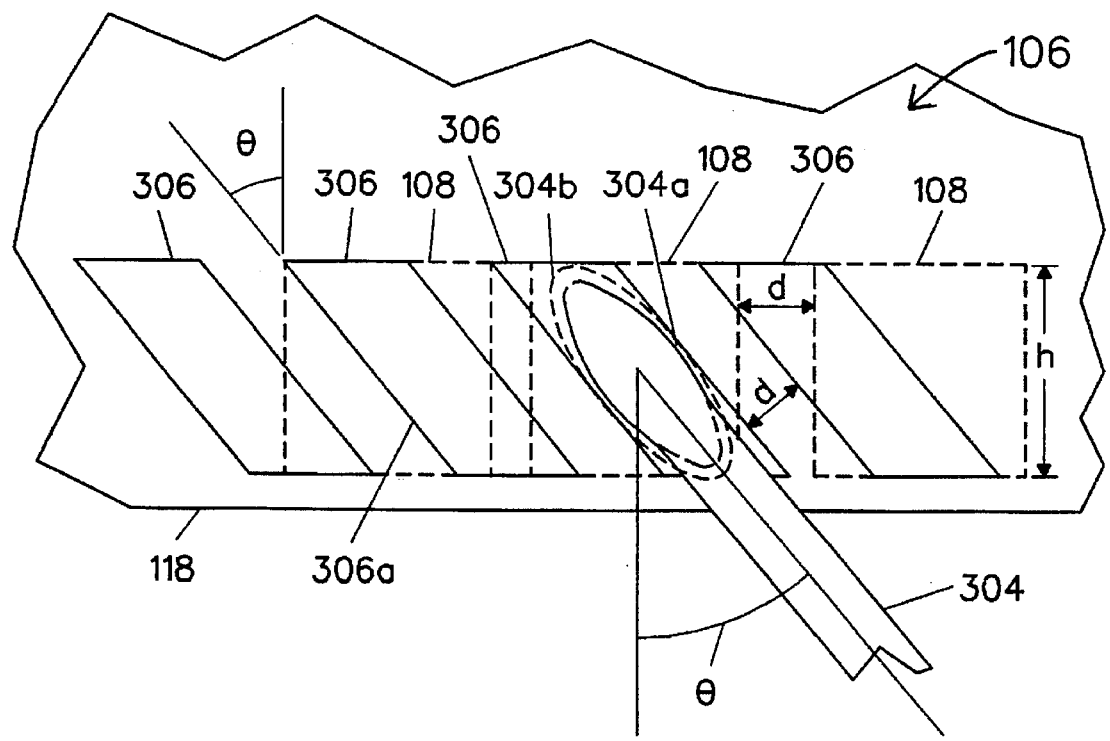
FIGS. 3a–3c are plan views of various approaches to increasing bond pad density, according to the present invention.
Figure 3B:
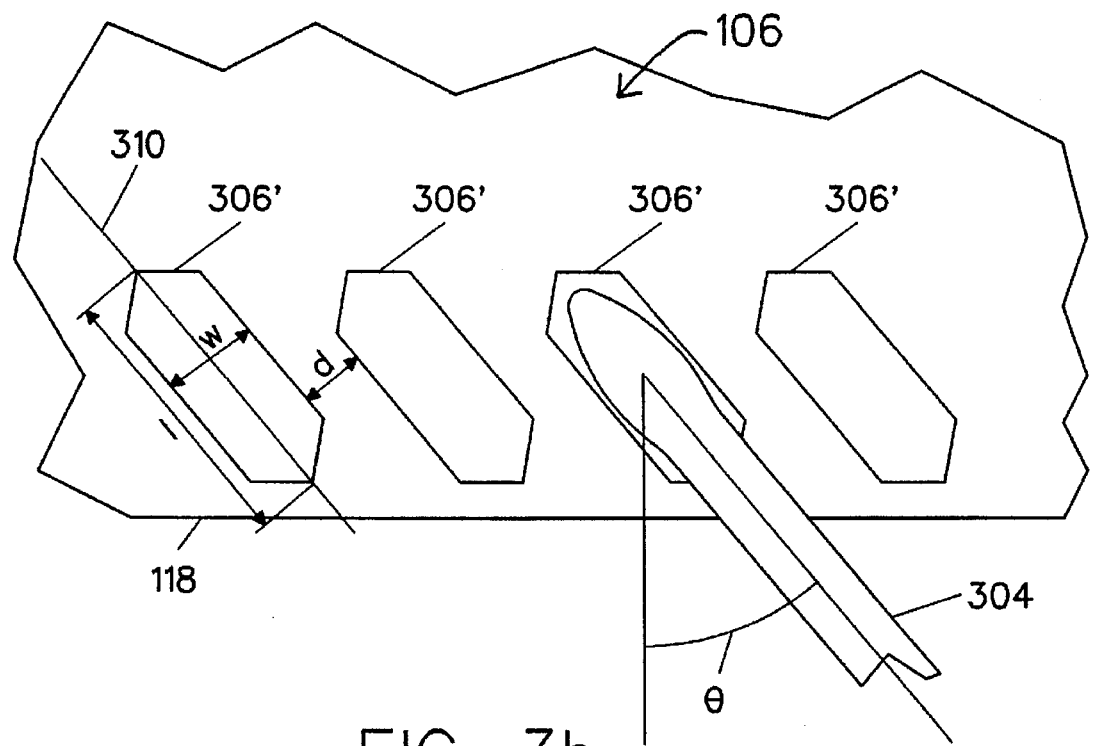
Figure 3C:
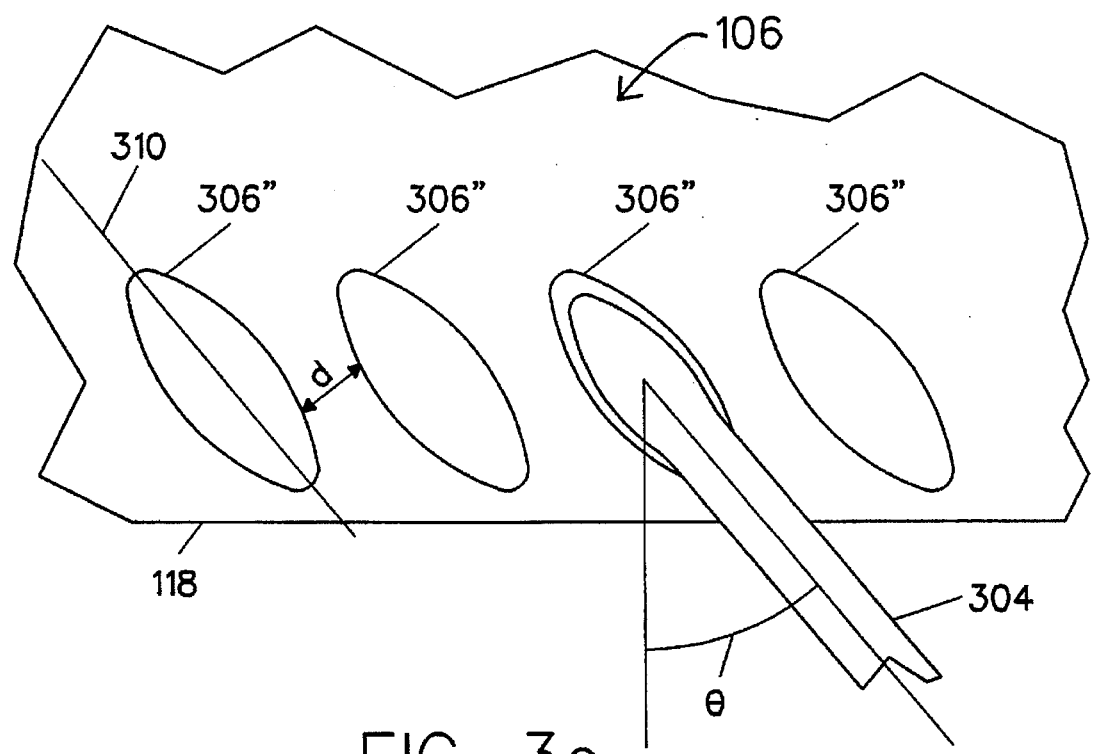

FIGS. 3a–3c show various possible bond pad shapes and arrangements according to the present invention. For all of these FIGS. 3a–3c, a uniform approach angle is assumed. (In other words, all of the bond wires approach bond pads at the same angle with respect to the edge of the die.)

FIG. 3a shows a series of elongated parallelogram-shaped bond pads 306 arranged on a die 106 such that a minimum distance "d" is maintained between adjacent bond pads. These bond pads are each designed to accommodate a bond wire, such as bond wire 304, having an approach angle Θ. The geometric shape of the bond pad 306 is determined by providing sufficient area to accommodate not only a contact footprint 304a, but also a "safety zone" area 304b around the contact footprint 304a, then fitting a parallelogram to (around) the resulting area requirement. The safety zone 304b allows for some (predetermined) error in placement of the bond wire (or more generally, the conductive line), allows for some error in the approach angle, and allows for some variation in the shape or size of the contact footprint. The slanted sides 306a of the bond pads 306 are substantially aligned with the approach angle Θ of the bond wire 304 and take up significantly less space than do the square bond pads 108 of the prior art. (The bond pads 108 of the prior art are shown in dashed lines for size comparison.) Square bond pads 306 have the same height "h" as do the parallelogram shaped bond pads 306, but have a width equal to their height. The same spacing "d" is maintained between adjacent square bond pads and adjacent parallelogram shaped bond pads, as shown in the Figure.

In this example, four parallelogram shaped bond pads 306 require just about the same peripheral area of the die as do three comparable square bond pads 108, thus providing approximately a 33% increase in bond pad density (count) over square bond pads, hence allowing for a greater number of electrical (I/O) interconnections to the die.

The parallelogram shaped bond pads 306 in FIG. 3a have four straight edges. It is often desirable, for simplicity of layout, to have one of the bond pad edges parallel to the edge 118 of the integrated circuit die, and to have an opposing edge parallel thereto. In this manner, the outer (i.e., towards the die edge) edges of the bond pads can be established to lie along a line parallel to the corresponding edge of the die, and the opposite, inner edges of the bond pads lie will also lie along a line parallel to the corresponding edge of the die. When approach angles are not perpendicular to the edge of the die, and the elongated bond pad is oriented along the direction of the approach angle, this can result in a bond pad shape, orientation and layout such as that of the parallelogram shape shown in FIG. 3a.

FIG. 3b shows an alternate embodiment of bond pads 306' accommodating bond wires 304, according to the present invention. In this case, a somewhat diamond shaped bond pad is used, similar to the parallelogram shaped bond pads of FIG. 3a. However, portions (namely corners) of the pads 306' lying outside of the safety zone are "trimmed" to provide the shape shown. As in FIG. 3a, a minimum space "d" is maintained between adjacent bond pads. Each bond pad has a long dimension "l" and a short dimension "w". The bond pad is oriented such that the short dimension is maintained generally perpendicular to the approach angle Θ of the bond wires 304, also indicated by line 310. In this example, the approach angle and the long dimension of the bond pad are aligned, since the long and short dimensions of the bond pad are perpendicular to one another. However, this is not necessarily the case with all elongated shapes. Parallelograms, for example have long and short dimensions which are not necessarily perpendicular to one another. Preferably, as illustrated herein, the short dimension of the bond pad is maintained perpendicular to the approach angle, which works for many elongated bond pad shapes.

FIGS. 3a and 3b are illustrative of some polygonal bond pad configurations, according to the present invention. Further polygonal configurations are set forth hereinbelow.

FIG. 3c illustrates non-polygonal bond pads, according to the present invention. In this case elliptical bond pads 306" are used. The major axis 310 of the ellipse shape is aligned with the approach angle Θ of the bond wire. The same spacing (d) between bond pads is maintained as in FIGS. 3a and 3b. The bond pad may be any suitable curved shape which can be circumscribed about the established safety zone (see, for example, 304b with respect to FIG. 3a) surrounding an elongated contact footprint, including a shape that is substantially similar to the shape of the safety zone.

The assumption is made herein that the contact footprint made by a bond wire with a bond pad is aligned with the approach angle. It is possible that for some bond wire attachment schemes the contact footprint may be slightly differently oriented. For those schemes, the different (non-uniform) contact footprint orientation must be taken into account. However, as long as a contact footprint has an elongated shape, the principle of shaping bond pads to accommodate the contact footprint may be applied to provide increase bond pad density on dies.

Figure 1:
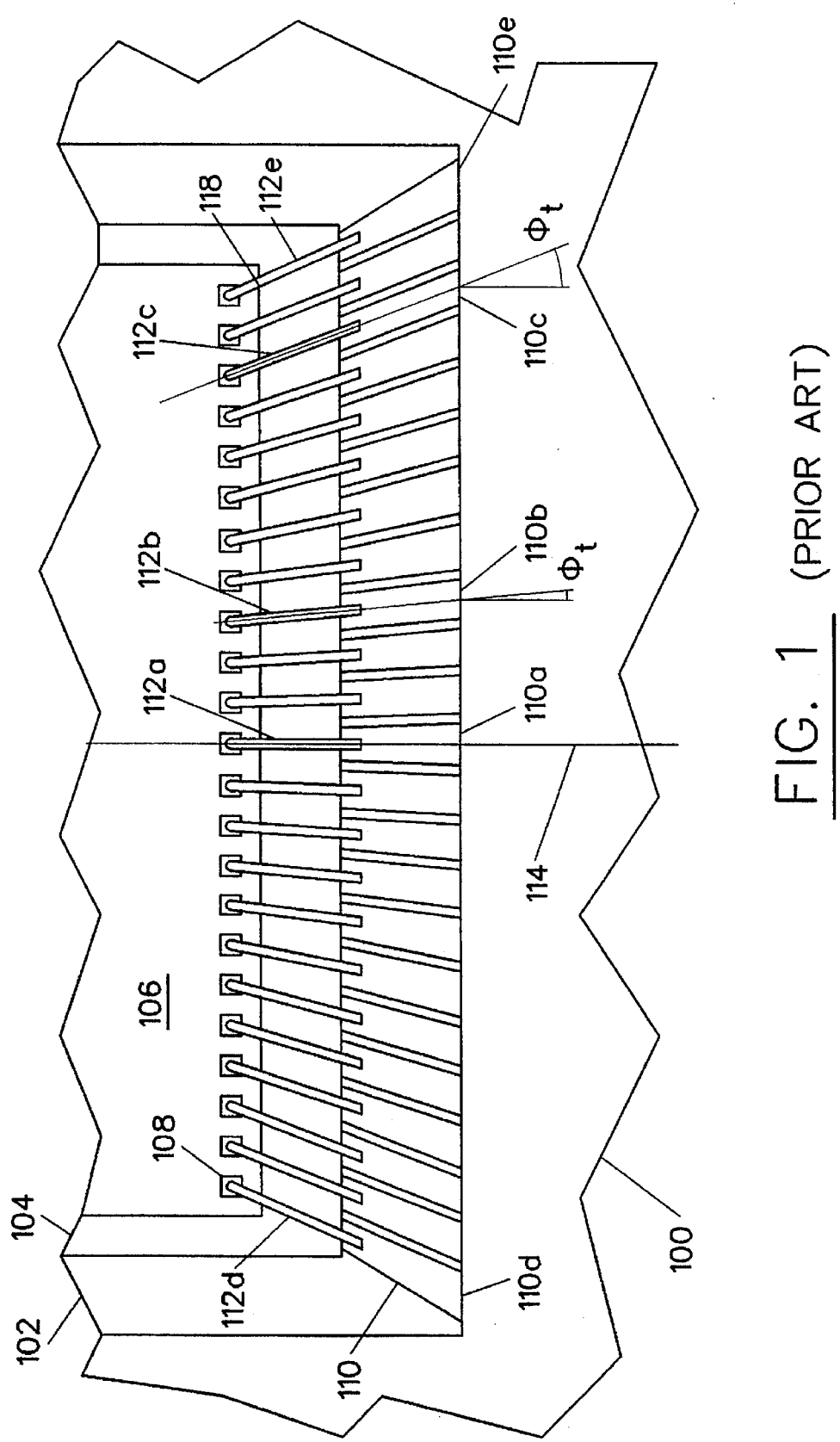
FIG. 1 is a plan view of a typical prior art bond pad arrangement and bond wire connections thereto.

FIGS. 3a–3c have shown various bond pad shapes oriented to accept bond wires arriving at a constant approach angle. However, in reality, bond wires-approach from a number of different angles, as is illustrated in FIG. 1.

Figure 4:
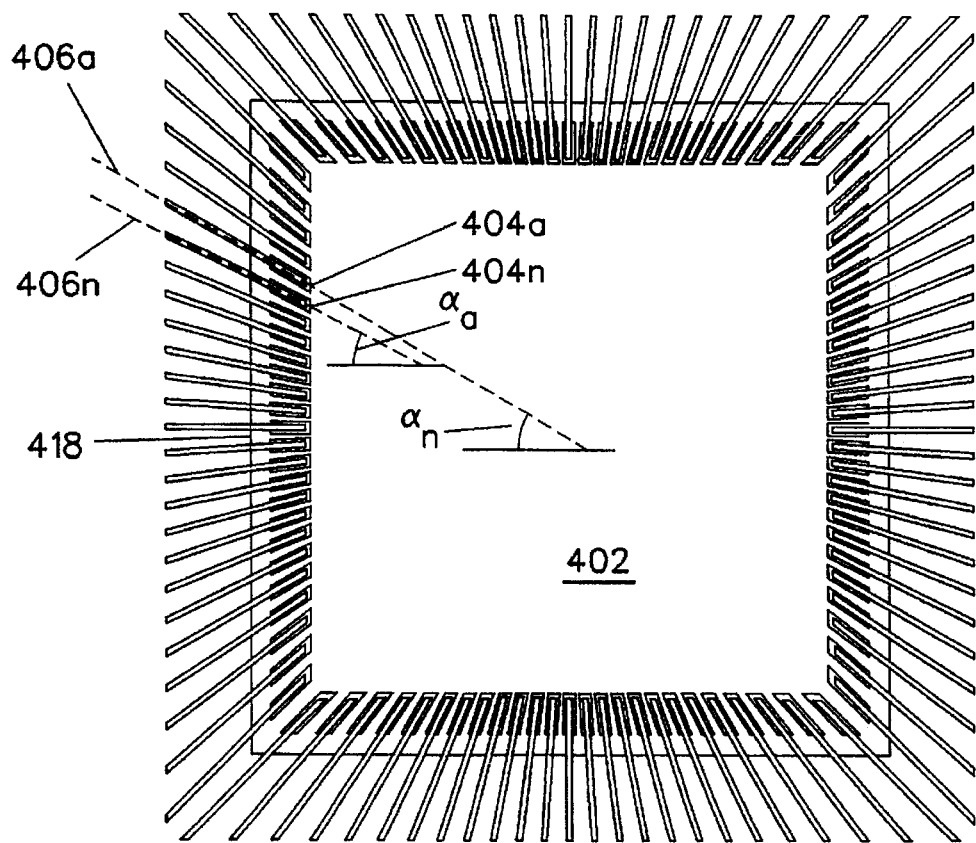
FIG. 4 is a plan view of an integrated circuit die employing the present inventive technique.

FIG. 4 shows a typical die 402 employing the technique of the present invention as applied to a radial pattern of conductive lines (or bond wires) 406a ... n. Each conductive line 406a ... n may have its own unique approach angle αa ... n. Each bond pad 404a ... n is aligned to the approach angle of the corresponding conductive line 406a ... n (or to the angle of the contact footprint made therewith, if the orientation of the contact footprint differs from the approach angle of the conductive line). As shown, conductive lines 406 approach (fan-in towards) the die 402 in a generally radial pattern.

In order for bond pads to align with a radial pattern of conductive lines while maximizing the number of bond pads which will fit on a die, it is advantageous to use an elongated tapered pad shape. The bond pads 404a ... n shown in FIG. 4 taper slightly towards the center of the die 402, as illustrated in greater detail in FIG. 5.

Figure 5:
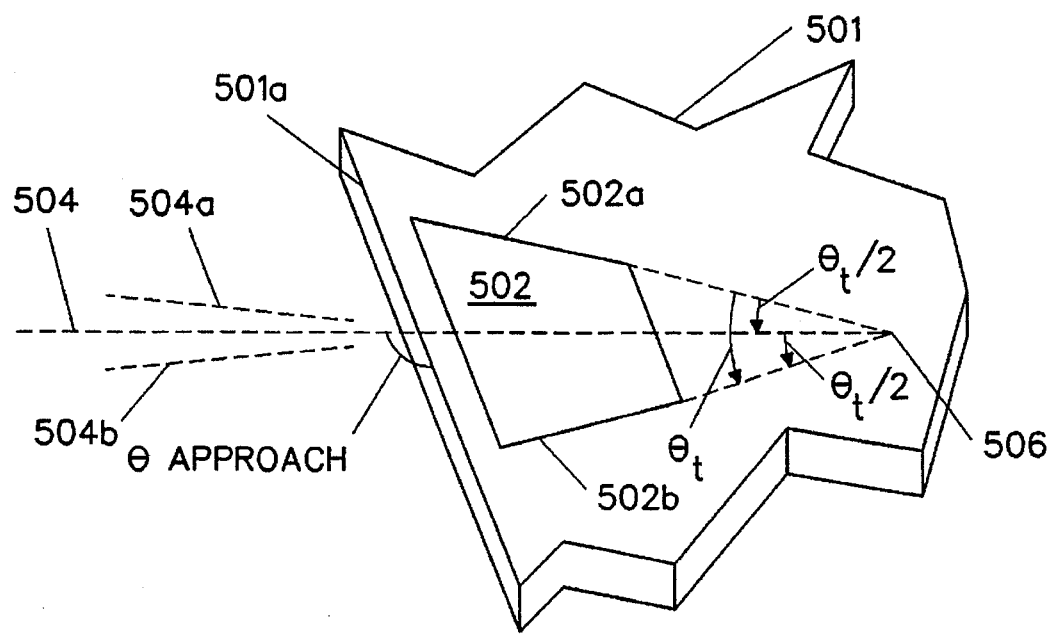
FIG. 5 is a view of a section of an integrated circuit die showing the orientation of a tapered bond pad, according to the present invention.

FIG. 5 shows a tapered bond pad 502 having tapered sides 502a and 502b on a die 501. The bond pad 502 is oriented such that it aligns with an approach angle $\Theta_{APPROACH}$ measured between major axis 504 of bond pad 502 and an edge 501a of die 501. Axis 504 indicates the line along which a bond wire or other conductive line will approach the bond pad 502. If lines are extended from tapered sides 502a and 502b, they will eventually meet at a point 506, defining a taper angle $\Theta_T$. Ideally, the axis 504 should bisect this angle, as shown, indicating the ideal angle of approach to tapered bond pad 502. Accordingly, tapered bond pad 502 would be oriented on the die 501 such that its axis 504 aligns with the anticipated approach angle. If a small range of approach angles is anticipated (as indicated by dashed lines 504a and 504b), and assuming that the bond pad 502 has been sized to accommodate a range of approach angles, then the axis 504 should bisect that range, as shown.

The discussion above with respect to FIGS. 4 and 5 assumes that the major axis of a contact footprint (the line perpendicular to its minimum overall dimension) is in perfect alignment with the approach angle of the conductive line with which it is made. For some methods of attachment, however, there may be an offset between the approach angle of the conductive line and the major axis of the contact footprint. In these cases, the same technique described hereinabove may be used by providing a compensation for this offset in the orientation of the bond pads. That is, use the major axis of the anticipated contact footprint as the approach angle.

All of the bond pads discussed hereinabove with respect to the present invention have, by definition, an "elongated" shape. This is because they have an overall width in a direction generally perpendicular to an expected approach angle which is significantly less than their overall length along the approach angle. That is, they are long along the anticipated approach path of a bond wire, and narrow across that same approach path. This permits more of these shapes to be arranged along the edge of an integrated circuit die than could be arranged using prior-art square bond pads (compare, e.g., FIGS. 1 and 2).

The discussion hereinabove with respect to FIGS. 1–5 indicates that individual conductive lines (including bond wires) may approach from a range of angles, but the designs of individual bond pads have been for a fairly precise approach angle, allowing only for small errors in placement or approach angle.

FIGS. 6a–6d illustrate the design of bond pads, according to the present invention, where a wider range of approach angles may be encountered at any individual bond pad.

Figure 6A:
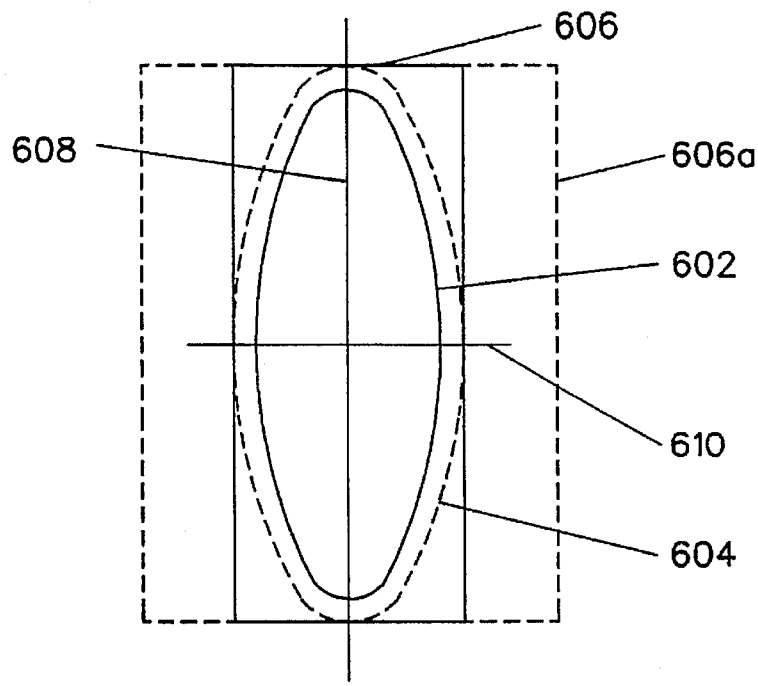
FIGS. 6a–6d are plan views of bond pads showing the relationship between the contact pattern made by a bond wire with a bond pad, the approach angle, "anchor points" and bond pad shape, according to the present invention.

FIG. 6a shows a simple rectangular bond pad 606 designed to accommodate an elliptical contact footprint 602 having a major axis 608 and a minor axis 610. A safety zone 604 is allocated around contact footprint 602, and then rectangular bond pad 606 is sized to fit exactly around the safety zone 604. One of the two short edges of the bond pad is oriented towards the edge of the die.

For size comparison, a square bond pad 606a of the prior art is shown overlaid in dashed lines. This is a particularly good comparison, because the square bond pad 606a represents a minimum-size square bond pad. Evidently, the rectangular bond pad permits a greater number of bond pads to be placed along an edge of a die than does the prior-art square bond pad.

Figure 6B:
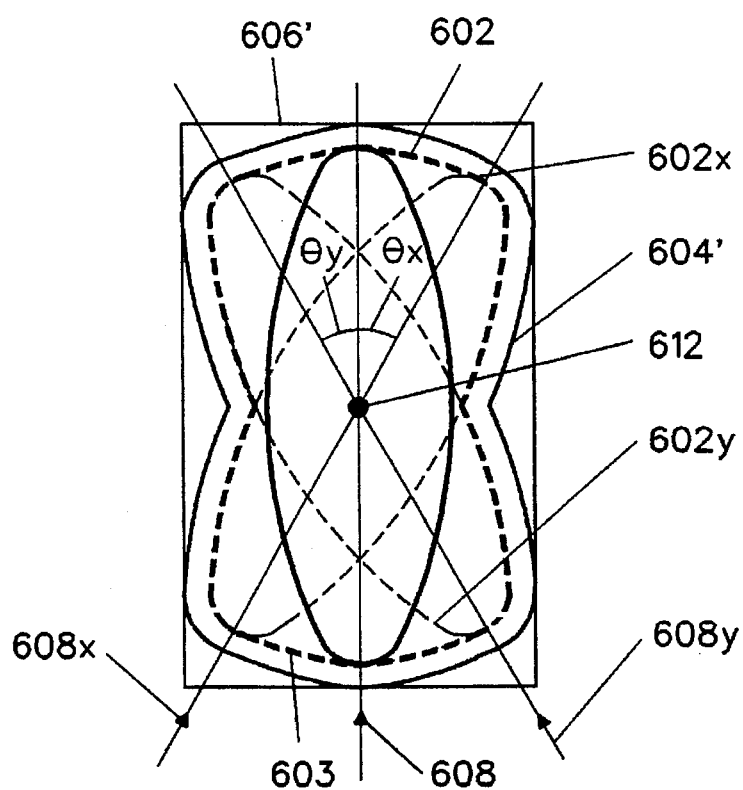

FIG. 6b shows a rectangular bond pad 606' designed to accommodate a wide range of approach angles. Contact footprint 602 (made by an electrical connection to a bond pad by a conductive line) is shown in its nominal position. Contact footprints 602x and 602y represent the orientation of contact footprint 602 if rotated about a point 612 through angles of $\Theta_x$ and $\Theta_y$, respectively. The pattern formed by "sweeping" the contact footprint 602 through its possible range of approach angles defines the shape and size of a swept contact area 603 which must be allocated on the bond pad for attachment of the conductive line. A safety zone 604' is allocated around the allocated swept contact area to allow for slight errors in placement and variation in contact footprint. Finally, a rectangular bond pad shape 606' is determined by circumscribing a rectangle around safety zone 604'. The major axes 608, 608x, and 608y of contact footprints 602, 602x, and 602y, respectively, illustrate the range of approach angles for which pad 606' is designed.

A similar approach may be applied to bond pads of other shapes, according to the present invention—for example, tapered pads, parallelogram shapes, curved shapes, etc., resulting in bond pad shapes that will' be referred to hereinafter as "certain non-square" shapes.

In the extreme, where the range of approach angles for a given bond pad is very wide (e.g., +/–45 degrees and greater), the shape of the rectangular (or other shape) bond pads 606' formed as described with respect to FIG. 6b, widens and may become arbitrarily similar to the shape of prior-art square bond pads (e.g., 606a, FIG. 6a), providing no benefit thereover. Evidently, then, there is still a need for a technique which provides both higher bond pad density and accommodation of a very wide range of approach angles)

Figure 6D:
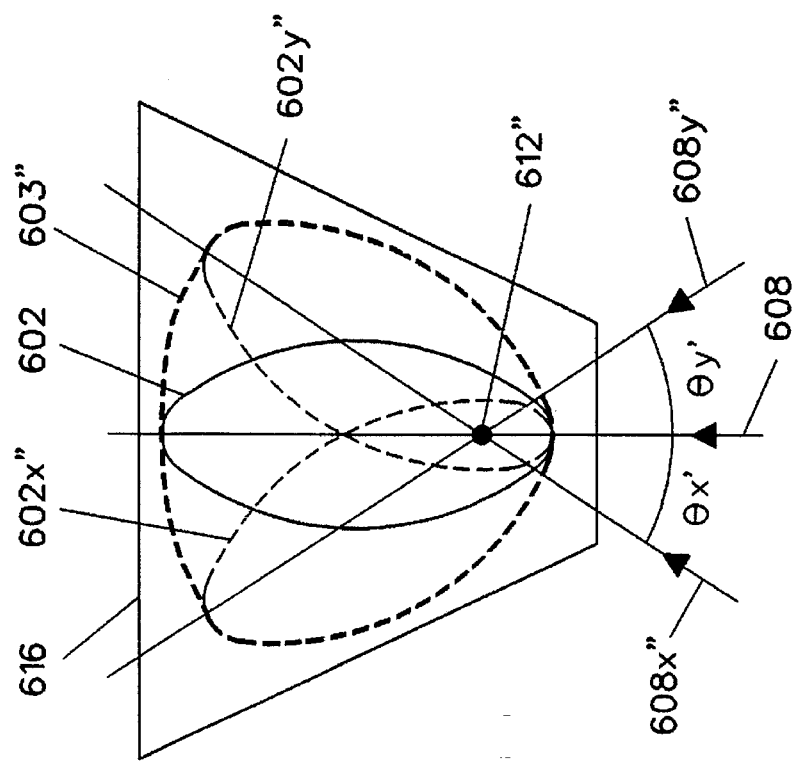
Figure 6C:
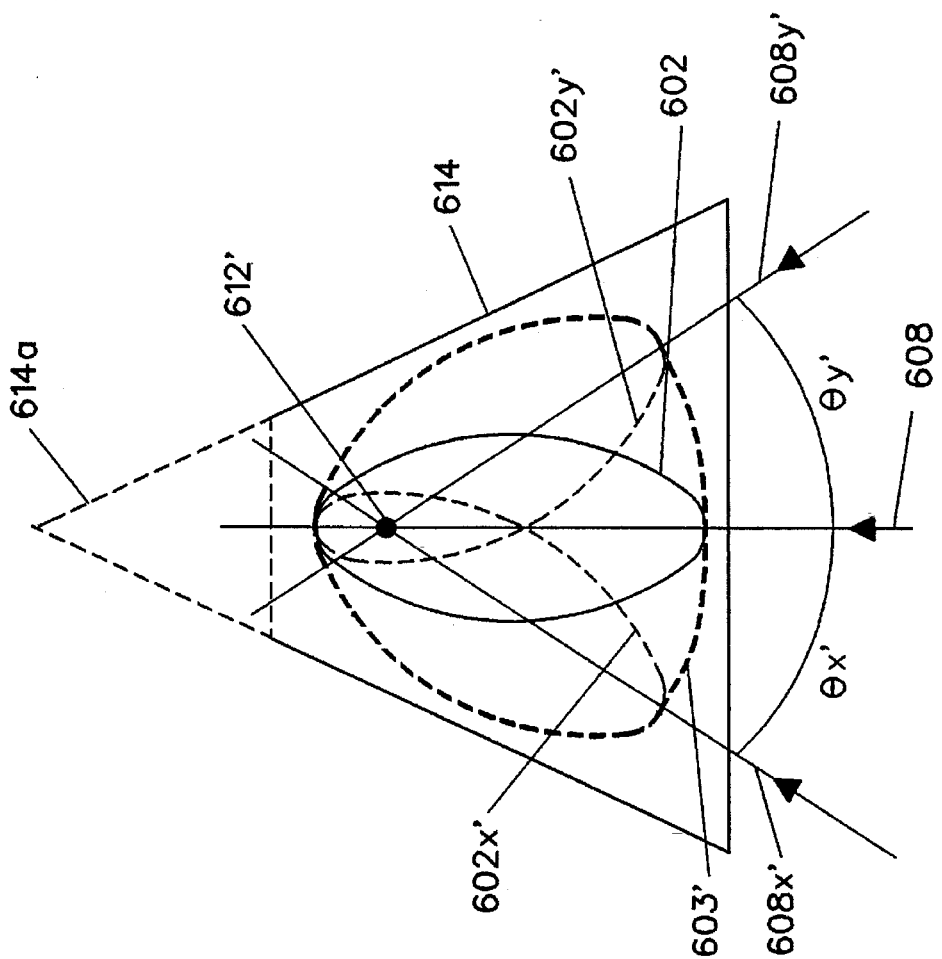

FIGS. 6c and 6d show different bond pad shapes which are derived from changing the pivot point used to determine the swept contact area.

In FIG. 6c, the contact pivot point 612' is moved upward in contact footprint 602 relative to its location 612 in FIG. 6b yielding a differently shaped swept contact area outline 603'. Contact footprints 602x' and 602y' represent the position of contact footprint 602 when rotated about pivot point 612' through angles of $\Theta_x$ and $\Theta_y$, repectively, as measured from the major axis 608 of contact footprint 602 to the major axes 608x' and 608y' of rotated contact footprints 602x' and 602y', respectively. Allowing for a safe zone (not shown) around swept contact area 603', a convenient polygonal shape is chosen for bond pad 614. This trapezoidal shape matches well with the shape of the swept contact area outline 603' and does not leave a great deal of unallocated space. Alternatively, the triangle shape indicated by adding the area 614a to the trapezoidal bond pad 614 could be used. However, the additional area would be of no benefit for the immediate purposes of the present invention.

In FIG. 6d, the contact pivot point 612" is moved downward in contact footprint 602 relative to its location 612 in FIG. 6b yielding a yet another differently shaped swept contact area outline 603", which is essentially a vertical mirror image of swept contact area outline 603' with respect to FIG. 6c. Contact footprints 602x' and 602y' represent the position of contact footprint 602 when rotated about pivot point 612" through angles of $\Theta_x$ and $\Theta_y$, respectively, as measured from the major axis 608 of contact footprint 602 to the major axes 608x" and 608y' of rotated contact footprints 602x" and 602y", respectively. Allowing for a safe zone (not shown) around swept contact area 603", a polygonal shape similar to that of bond pad 614 is chosen for bond pad 616. Again, this trapezoidal shape matches well with the shape of the swept contact area outline 603" and does not leave a great deal of unallocated space.

The following definitions may be used herein:

Conductive line: A bond wire, conductive trace, or conductive lead used for direct connection to a bond pad on an integrated circuit die.

Bond pad: An electrical connection point located along an edge of an integrated circuit die.

Contact footprint: The shape of the contact area made between a conductive line and a bond pad.

Elongated contact footprint: An asymmetrical contact footprint which has a length which is greater than its width. Elongated contact footprints have a major axis aligned such that their dimension perpendicular to the axis is as small as possible.

Contact pivot point: A point of reference on a contact footprint about which it is rotated to generate a swept contact area.

Anchor point: A point of reference on a bond pad for connecting to conductive lines.

Expected contact footprint: The contact footprint expected to be formed when a conductive line is connected to a bond pad.

Certain non-square bond pad: A bond pad that is not square, and that substantially-conforms to a shape that encloses an area defined by the rotation of an elongated contact footprint through a limited range of angles about a "contact pivot point".

Bond pad axis: Defined by the axis of the elongated contact footprint used to define a "certain non-square" bond pad when at the middle of its range of rotation about the contact pivot point.

Approach angle: The angle a conductive line connected to a bond pad makes with the edge of the integrated circuit die along which the bond pad is located. "Expected approach angle" refers to the approach angle for which a bond pad is designed. In the event that the major axis of a contact footprint is not aligned with the approach angle of a conductive line, then the angle of the major axis of the contact footprint is taken as the approach angle.

Major Axis of a bond pad: The line centered in the expected range of approach angles. This line runs through the anchor point on "certain non-square" bond pads.

Elongated bond pad: A bond pad for which the length along its major axis is greater than its maximum width perpendicular to its major axis by a ratio of at least, for example, 20%, 30%, 50%, 70%, or 100%.

Examples of "certain non-square" bond pad shapes are: "elongated" rectangles (i.e. rectangles having an aspect ratio of greater than 1.2:1), triangles, trapezoids (truncated triangles), parallelograms, ellipses, or any other suitable polygonal or curved shapes.

According to a feature of the invention, every "certain non-square" bond pad has an associated anchor point, expected contact footprint, and contact pivot point. For any approach angle a conductive line will be mounted such that the contact pivot point of the expected contact footprint aligns with the anchor point of the bond pad.

Generally, when the contact pivot point is placed away from the center of the contact footprint, the result will be a "certain non-square" bond pad shape which is wide on one end and narrow on another end. As shown in FIGS. 6c and 6d, it is possible to come up with complementary bond pad shapes (e.g., 614 and 616). It would appear that bond pad shapes 614 and 616, which are complementary to one another, might be useful if arranged in an alternating interleaved pattern. This arrangement is shown in FIGS. 7a and 7b.

Figure 7A:
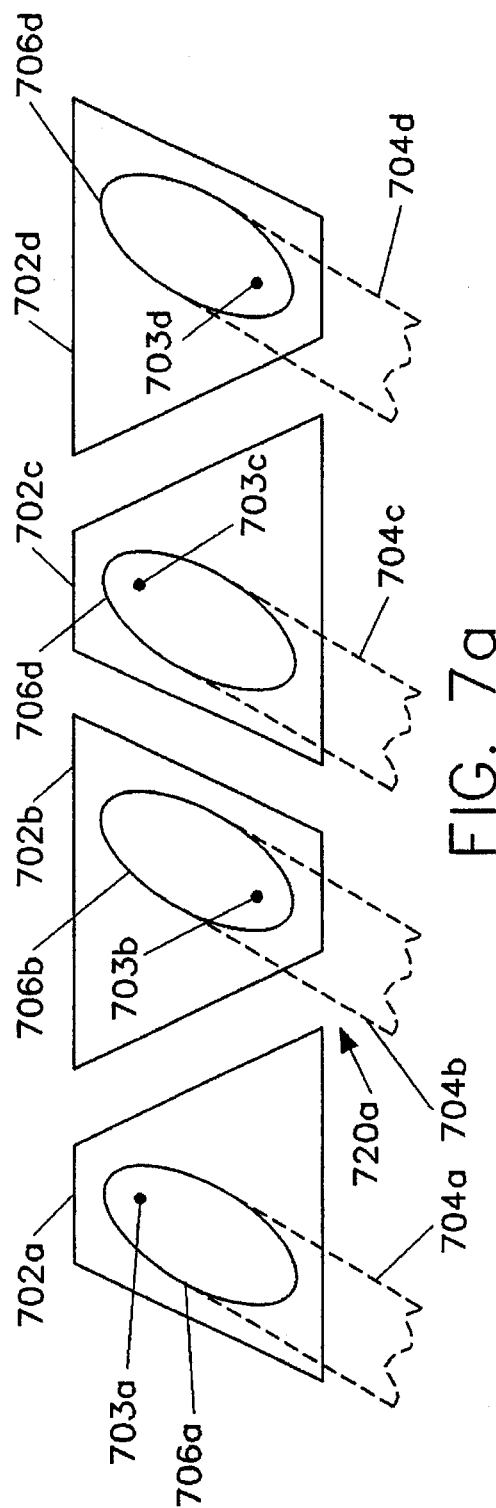
FIGS. 7a–7b are plan views of bond pads, showing an application of an alternating interleaved arrangement of complementary polygonal bond pad shapes, according to the present invention.

In FIG. 7a, bond pads 702a, 702b, 702c, and 702d are arranged in an alternating interleaved array, as shown, where bond pads 702a and 702c (similar to 614 with respect to FIG. 6c) have similar shapes complementary to the shapes of bond pads 702b and 702d (similar to 616 with respect to FIG. 6d). Bond pads 702a, 702b, 702c, and 702d have anchor points located at 703a, 703b, 703c, and 703d, respectively, reflective of the manner in which each shape was derived (refer to FIGS. 6c, 6d). In order to illustrate the method of connection of bond wires to these bond pads, bond wires 704a, 704b, 704c, and 704d, are shown approaching bond pads 702a, 702b, 702c, and 702d, respectively, at approach angles near one extreme of the anticipated range of approach angles used to design the bond pads. The connection of bond wires 704a, 704b, 704c, and 704d to bond pads 702a, 702b, 702c, and 702d, forms contact footprints 706a, 706b, 706c, and 706d, respectively therewith. The bond wires are mounted such that the contact pivot point of contact footprint 706a aligns with the anchor point 703a of bond pad 702a, the contact pivot point of contact footprint 706b aligns with the anchor point 703b of bond pad 702b, the contact pivot point of contact footprint 706c aligns with the anchor point 703c of bond pad 702c, and the contact pivot point of contact footprint 706d aligns with the anchor point 703d of bond pad 702d.

Figure 7B:
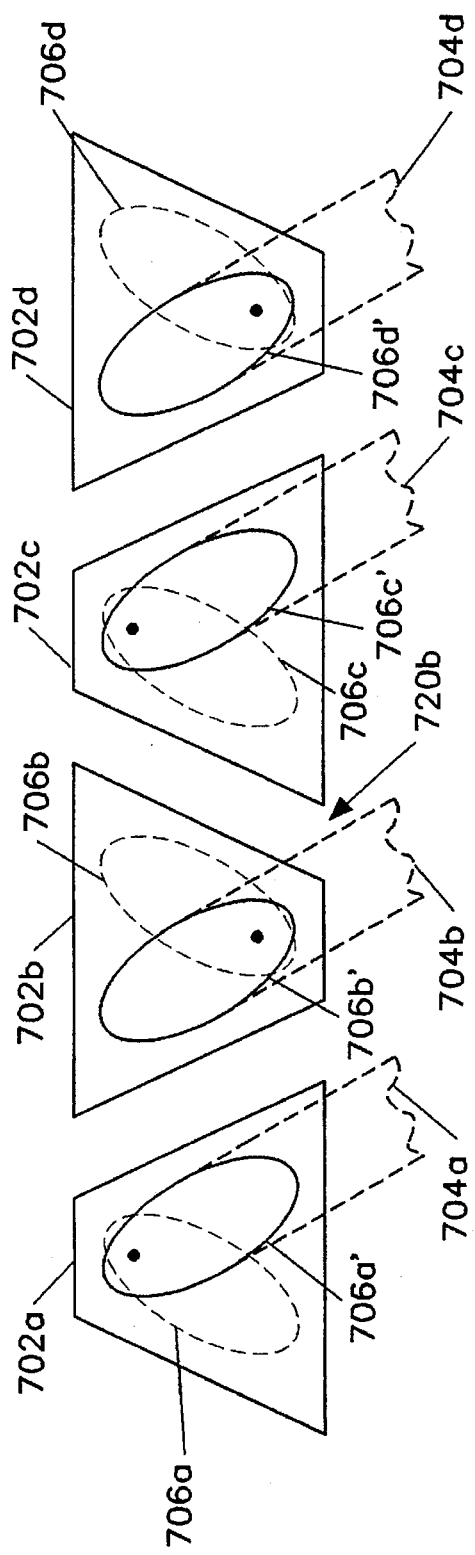

FIG. 7b shows the same bond pads 702a, 702b, 702c, and 702d, and the same bond wires, 704a, 704b, 704c, and 704d, but this time the bond wires have a different approach angle, near the opposite end of the expected range of approach angles from that used in FIG. 7a. Coming from this approach angle, bond wires 704a, 704b, 704c, and 704d, make contact footprints 706a', 706b', 706c' and 706d' respectively. The contact footprints 706a, 706b, 706c, and 706d are superimposed and shown as dotted lines for comparison.

The bond pad arrangements of FIGS. 7a and 7b may encounter problems with shorting or coupling with adjacent bond pads if the bond wires do not arch significantly over the surface of the integrated circuit die before attaching to the bond pads. Note for example the location 720a with respect to FIG. 7a where bond wire 704b closely approaches a corner of bond pad 702a. Also note with respect to FIG. 7b the location 720b where bond wire 702b closely approaches a corner of bond pad 702c.

One approach to solving this problem is to increase the spacing between all bond pads, but this approach would significant reduce the effective bond pad density, eliminating much of the benefit of the present invention.

A more attractive approach to solving this problem is shown in FIG. 7c, whereby corners 712 of bond pads 712a and 712c are eliminated, yielding modified bond pads 702a' and 702c'. With the elimination of these corners, the potential interference between bond wires and neighboring bond pads is eliminated. Note that modification of bond pads 702b and 702d is not necessary, since the corresponding corners of these bond pads, which are oriented away from the approach path of the bond wires, do not pose a risk of shorting. However, for uniformity (implying simplicity of layout) and to minimize coupling between adjacent bond pads, it may be desirable to modify bond pads 702b and 702d as well.

FIG. 7d shows this situation, where all bond pads have the modified shape, including modified bond pads 702b' and 702d'.

Figure 7E:
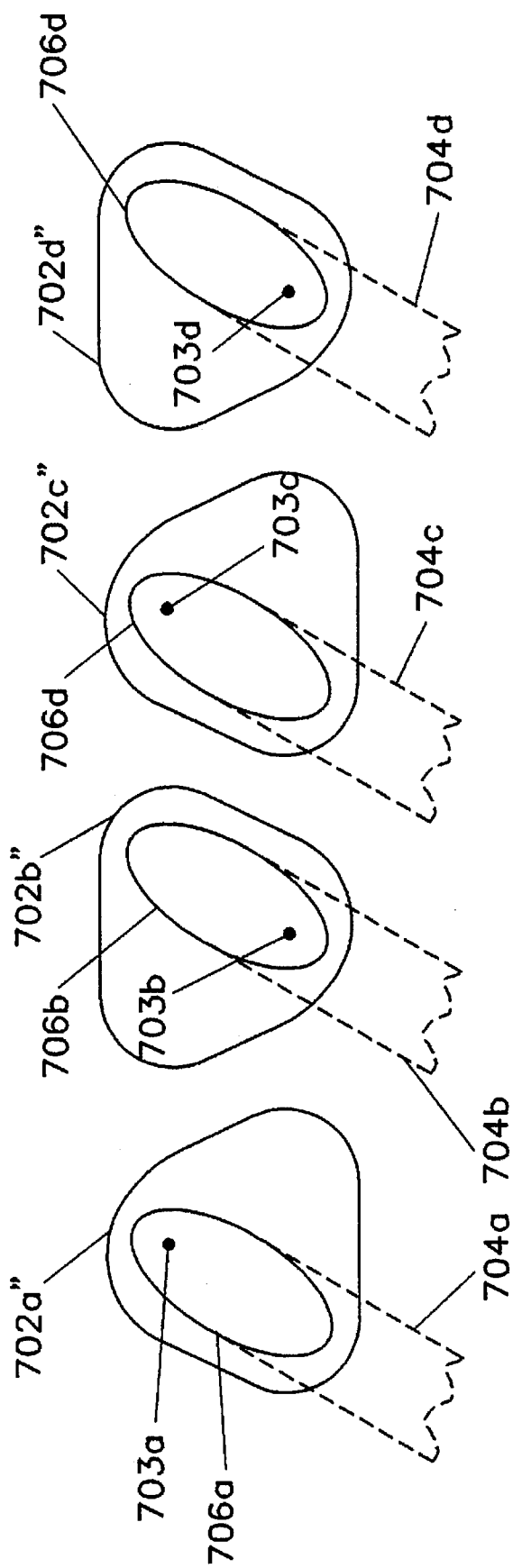
FIG. 7e is a plan view of non-polygonal curved bond pads showing the use of complementary curved shapes for an alternating interleaved arrangement of bond pads, according to the present invention.

An alternative approach is shown in FIG. 7e, where non-polygonal curved shapes closely following the shape of the swept contact area (see FIGS. 6c and 6d) are used for bond pads 702a", 702b", 702c" and 702d". These bond pads have many of the same benefits discussed hereinabove, e.g., improvement of bond pad density, minimal risk of shorting or coupling between bond wires and adjacent bond pads, minimal coupling between bond pads, etc.

This approach of using interleaved bond pads requires that the method used to mount bond wires to such pads must take into account the varying (alternating) locations of anchor points relative the edge the semiconductor die and pivot points relative to the contact footprints that will be made with the bond wires. This requires that the wire-connecting method must use different points of reference on the bond pads and bond wires, depending upon which type of bond pad is to be connected to.

The concept of using interleaved bond pads, while shown with bond wires, is equally applicable to the other types of conductive lines discussed hereinabove, such direct attachment of bond pads to conductive leads or traces (e.g., leadframe attachment as in TAB packages).

With "certain non-square" contact shapes and alternating interleaved linear arrays of bond pads, as with elongated bond pads, the discussion hereinabove generally assumes that the major axis of a contact footprint is in perfect alignment with the approach angle. In cases where there is an offset angle between the major axis of the contact footprint and the approach angle, the same technique described hereinabove may be used by providing a compensation for this offset in the orientation of the bond pads, without loss of generality. That is, use the major axis of the anticipated contact footprint as the approach angle.

Other aspects of the present invention discussed hereinabove, such as radial patterns of bond pad orientation, tapered bond pad shapes, etc., may be used either alone or in combination with one another.

Using the techniques of the present invention, it is possible to create integrated circuits having significantly larger numbers of bond pads, which allow for a greater number of I/O connections and interface signals than would be possible using prior art bond pad design for a given die size. For example, for a given die size of the prior art accommodating some limited number of bond pads (at a given pad-to-pad spacing), the geometric configurations of the present invention will allow a substantial (on the order of 33%; or greater) increase in the number of bond pads that can be accommodated (on the same size die). In other words, whereas only four hundred bond pads could have been accommodated in the prior art, by using this invention I/O counts (number of bond pads) in excess of five hundred can readily be achieved. It is within the scope of this invention that semiconductor dies having in excess of "n" bond pads may be fabricated, where "n" is $\geq$500, 550, 600, 650, 700, 750, 800, 850, 900, 950 or 1000.

Bond Pad Construction

Figure 8A:
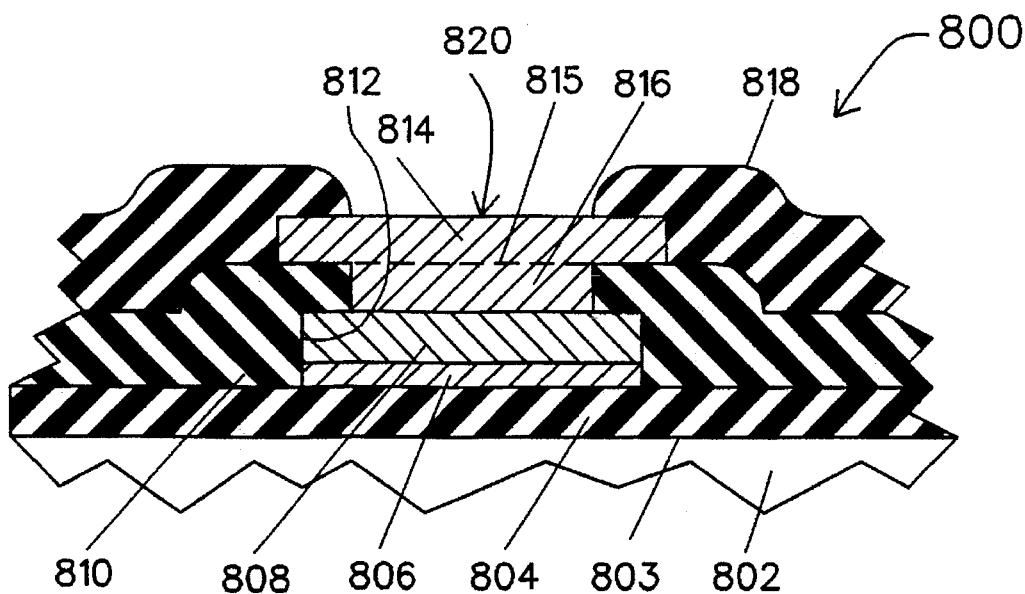
FIG. 8a is a cross-sectional view of a prior art bond pad.
Figure 8B:
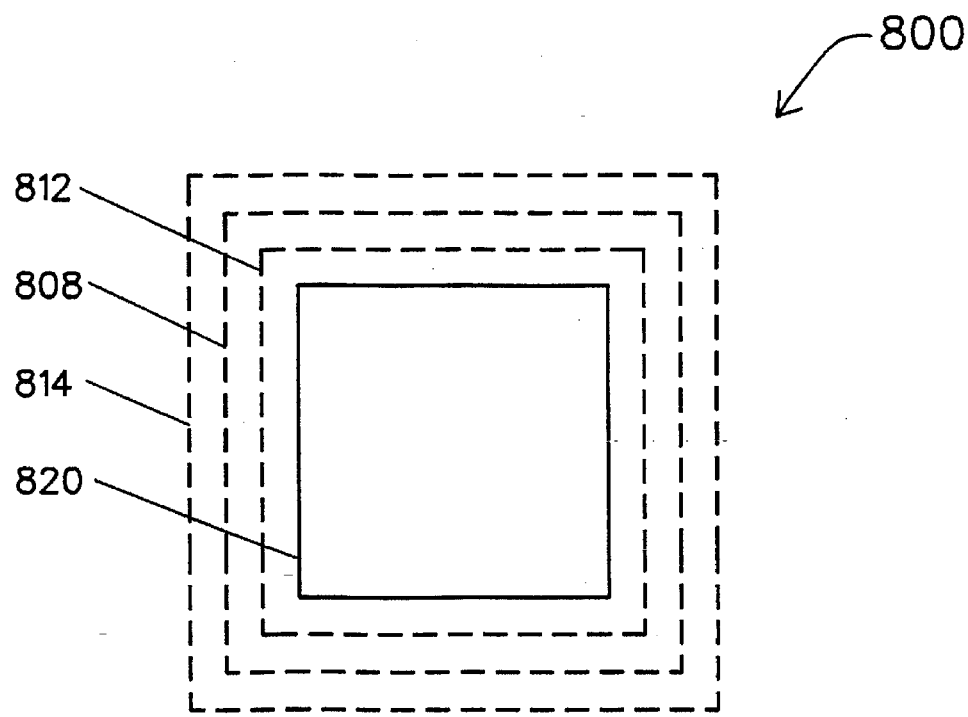

FIGS. 8a and 8b illustrate the structure (construction) of a prior art "composite bond pad" 800. Typically, a plurality of such bond pads would be disposed on a die. A partially-fabricated semiconductor die 802, having various diffusions and depositions (not shown), has a top surface 803. A layer 804 of insulating material (e.g., silicon dioxide) is formed on the surface 803. A patterned layer 806 of "barrier metal" is applied over the oxide 804. A patterned conductive layer 808 of "first" metal ("M1") is applied over the barrier metal 806, and is connected (not shown) to circuit elements (not shown) contained on the die. A layer 810 of inter-layer dielectric ("ILD"; e.g., silicon dioxide) is applied over the first metal layer 808, and is provided with an opening 812 extending through the layer 810 to the top surface (as viewed in the Figure) of the underlying M1 layer. A patterned conductive layer 814 of "second" metal ("M2") is applied over the ILD 810, and a portion 816 of this layer 814 forms a conductive "plug" filling the opening 812. A topmost "passivation" layer 818 (e.g., Borophosphosilicate Glass, or BPSG) is applied over the M2 and ILD layers, and is provided with an opening 820 extending through the passivation layer 818 to the top surface (as viewed in the Figure) of the underlying M2 layer. This leaves an area 820 of the top surface of the M2 layer exposed. The area 820 is termed the "contact area" ("bond site"). It is in this contact area that external connections to the die will be made, by any suitable means such as bond wires. Alternatively, gold bumps (not shown) or gold balls (not shown) can be formed atop the area 820, for tape-automated (TAB) bonding or flip-chip bonding to the die.

Figure 2:
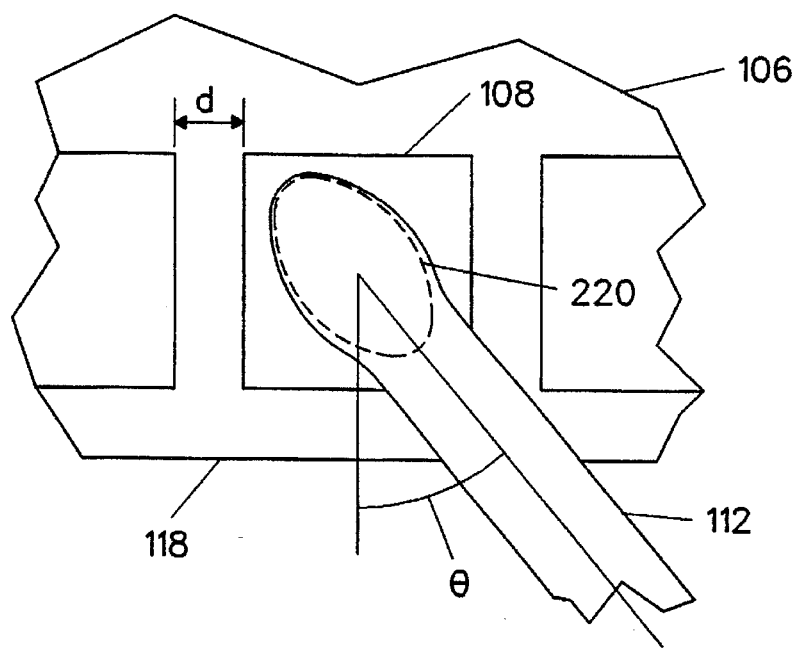
FIG. 2 is a plan view of a typical attachment of a bond wire to a bond pad according to the prior art.

In aggregate, the elements 814, 816 and 808 comprise the "composite bond pad" 800, which is comparable to the bond pad 108 shown in top view in FIGS. 1 and 2. For purposes of this discussion, the portion of the metal layer 814 above dashed line 815 is termed "upper bond pad", and the portion of the lower metal layer 808 underlying the upper bond pad is termed "lower bond pad". The use of a barrier metal layer (806) underneath the bond pad (i.e., underneath the M1 layer) is optional, and offers certain protection against diffusion into the M1 layer of "fugitive" species (contaminants, vis-a-vis the M1 layer) from underlying layers in the die.

As best viewed in FIG. 8b, the (composite) bond pad 800 is generally square (it is shown in the Figure as a slightly elongated rectangle), and has dimensions on the order of 100×100 μm (microns). Further, the upper bond pad may be larger than the "plug" 814. For example, if the upper bond pad measures 100 μm across, the plug may measure only 80–90 μm across. As is evident, only the outer peripheral region (for example the outermost 10% of the upper bond pad) of the upper bond pad rests on the ILD 810.

In practice, the lower bond pad element 808 may be a defined portion (shown as a slightly elongated rectangle) of a conductive line of the M1 layer.

In practice, a plurality of bond pads (800) are disposed on the top surface of the die, for making a plurality of input/output (I/O) connections to the die.

As mentioned above, ultimately the contact area 820 (i.e., the bond pad) is bonded to, whether with a bond wire, or by the mechanism of gold bumps/balls. These various processes typically impart mechanical and or thermal energy directly onto the bond pad, especially in the contact area. It has been observed that these bonding processes can cause the bond pad to delaminate (lift) from the underlying surfaces of multiple metal layers (e.g., 806) and oxide (e.g., 804). This bond pad lift problem can happen in all different kinds of bonding technology, such as aluminum wire bond, gold ball bonding, gold bump bonding, and others. This bond pad lift problem can become exacerbated when using an underlying layer of barrier metal (806), such as titanium (Ti), titanium nitride (TiN), Titanium-Tungsten (TiW), and the like, under the bond pads. Bond pad lift is very undesirable, and can result in potential problems in both assembly (packaging) yield and device reliability.

FIGS. 8a and 8b show a prior art bond pad structure, and have been discussed in detail hereinabove. Particularly, the problem of bond pad lift, using a large plug (816) between M2 (814) and M1(808), was discussed.

According to the present invention, a connection between M2 and M1 is made only around a small peripheral portion (band) of the bond pad.

Figure 9A:
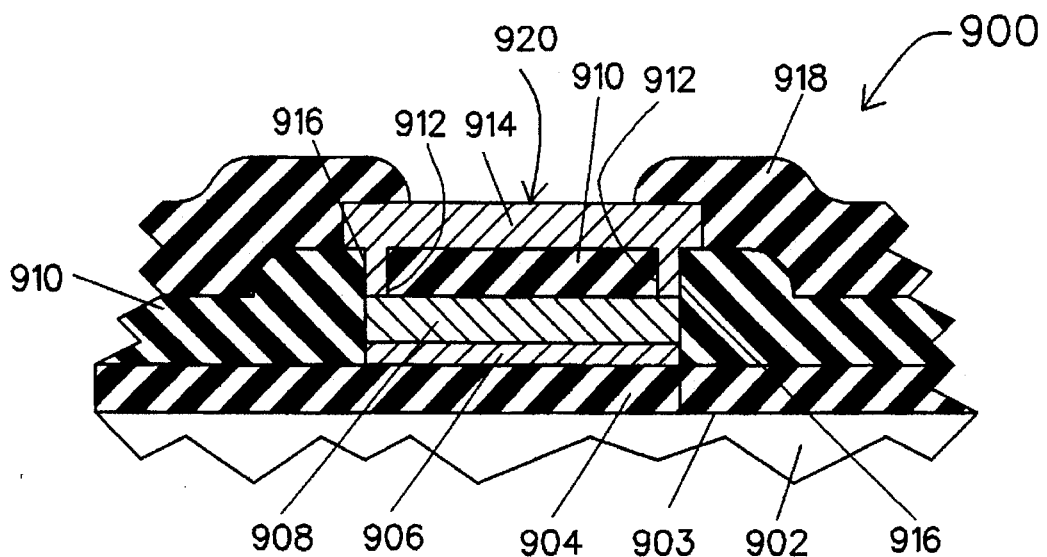
FIG. 9a is a cross-sectional view of an embodiment of a bond pad according to the present invention.
Figure 9B:
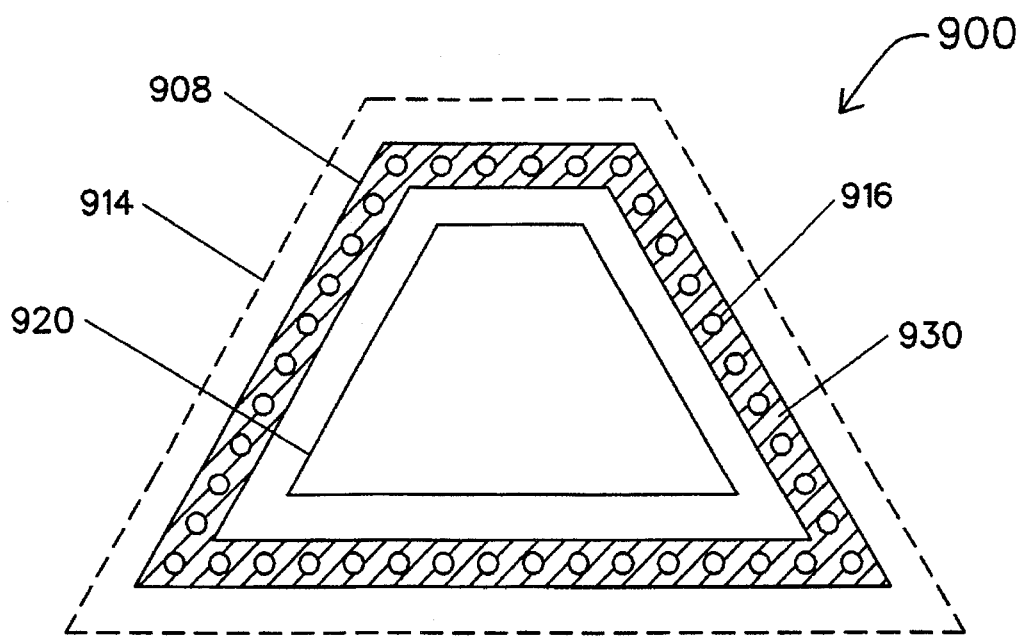

FIGS. 9a and 9b illustrate the structure of the composite bond pad 900 of the present invention, which may be any of the novel shapes discussed above, such as with respect to FIGS. 3a–3c, 4, 5, 6a–6d or 7a–7e. The trapezoidal bond pad shape of FIG. 6c is employed for exemplary purposes in the plan views of FIGS. 9b, 10a–10c.

A partially-fabricated semiconductor die 902, having various diffusions and depositions (not shown), has a top surface 903. A layer 904 of insulating material (e.g., silicon dioxide) is formed on the surface 903. A patterned layer 906 of "barrier metal" is applied over the oxide layer 904. A patterned conductive layer 908 of "first" metal ("M1") is applied over the barrier metal 906, and is connected (not shown) to circuit elements (not shown) contained on the die. A defined area of this M1 layer (best viewed in FIG. 9B) forms the lower bond pad element. A layer 910 of inter-layer dielectric ("ILD"; e.g., silicon dioxide) is applied over the first metal layer 908, and is provided with a plurality of small openings (vias) 912 extending through the layer 910 to a peripheral region of the lower bond pad 908. A patterned conductive layer 914 of "second" metal ("M2") is applied over the ILD 910, and a portion 916 of this layer 914 fills the openings 912. Alternatively, the openings 912 can be filled by selective deposition of a metal such as tungsten. The portion of the layer 914 overlying the ILD 910 is the upper bond pad element. A topmost "passivation" layer 918 (e.g., Borophosphosilicate Glass, or BPSG) is applied over the M2 and ILD layers, and is provided with an opening 920 extending through the passivation layer 918 to the top surface (as viewed in the Figure) of the underlying M2 layer. This leaves an area 920 of the top surface of the M2 layer exposed. The area 920 is termed the "contact area". As in the prior art, it is in this contact area (920) that external connections to the die will be made, by any suitable means such as bond wires. Alternatively, gold bumps (not shown) or gold balls (not shown) can be formed atop the area 920, for tape-automated (TAB) bonding or flip-chip bonding to the die.

In aggregate, the upper bond pad element 914, the lower bond pad element 908, that portion of the ILD 910 between the upper and lower bond pad elements, and the conductive material filling the opening 912 comprise the "composite bond pad" 900, per se. The use of a barrier metal layer (906) underneath the bond pad (i.e., underneath the M1 layer) is optional.

As best viewed in FIG. 9B, the bond pad 900 is generally trapezoidal, in plan view. Preferably, both the upper and lower bond pad components (elements) 914 and 908, respectively, are formed with the same geometric configuration, although the upper bond pad component 914 may be larger than the lower bond pad component 908 (as shown in FIG. 9a).

Attention is directed to a peripheral region 930 (shown shaded in FIG. 9b) of the lower bond pad element 908. The peripheral region 930 extends from the periphery of the area of the M1 layer defined as the lower bond pad 908, to approximately less than 10% (e.g., 10 μm) towards the center of the lower bond pad. Preferably, the peripheral region 930 is disposed entirely outside of the contact area 920. For example, if the lower bond pad element measures 100 μm across, the peripheral region may form a band only approximately 10 μm around the periphery of the lower bond pad element.

The vias 912 are illustrated in FIG. 9b as a single row ("string") of filled (916) vias extending around the periphery of the lower bond pad element, within the peripheral region 930. While shown as cylindrical (round cross-section), the vias may have any suitable cross-section, such as square, in which case they would be square columns. The cross-sectional dimension of the filled vias 916 is preferably on the order of 1.0–1.5 μm, and they are preferably spaced apart from one another by approximately 2.0–3.0 μm.

By disposing the conductive vias 912 outside of the contact area 920, bonding forces acting within the contact area are disposed substantially entirely over the ILD disposed between the upper and lower bond pad elements, rather than over the vias (e.g., 912) between the upper and lower bond pad elements.

As best viewed in FIG. 9a, by using a plurality of small vias 912 around the periphery of the bond pad, rather than the single large plug (812, FIG. 8a), the space between the upper and lower bond pad elements is substantially entirely (i.e., 90% or more) filled with ILD oxide 910.

As in the prior art, a plurality of composite bond pads (900) are disposed on the top surface of the die, for making a plurality of input/output (I/O) connections to the die.

As in the prior art, ultimately the contact area 920 is bonded to, whether with a bond wire, or by the mechanism of gold bumps/balls. These various processes typically impart mechanical and/or thermal energy directly onto the bond pad, especially in the contact area. It has been determined that the "metal-ILD-metal" (i.e., 914-910-908) structure of a composite bond pad of the present invention exhibits substantially less bond pad lift off problems than the "metal-metal-metal" (i.e., 814-816-808) composite bond pad structure of the prior art, especially when a barrier layer (806, 906) is employed. The composite bond pad structure of the present invention will thus exhibit a desirable improvement in both assembly (packaging) yield and device reliability.

Figure 10A:
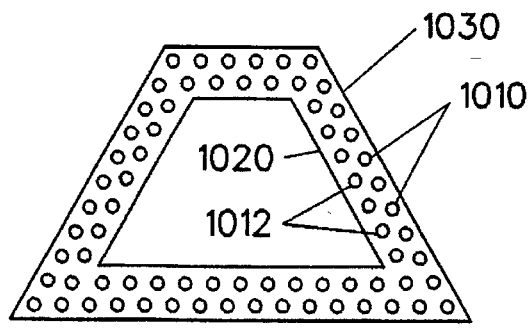
FIG. 10a is a top diagrammatic view of another embodiment of a bond pad, according to the present invention.

FIG. 10a shows an alternate embodiment of the invention. Two rows (strings) of filled vias are disposed all around the peripheral region 1030 (analogous to 930). The inner edge of the peripheral region extends no further inward than the contact area 1020 (analogous to 920). In the example, the vias are shown as round in cross-section, but they could be square or any other suitable shape. The vias in one string 1010 are preferably offset (staggered) from the vias of the adjacent string 1012, as shown.

Figure 10B:
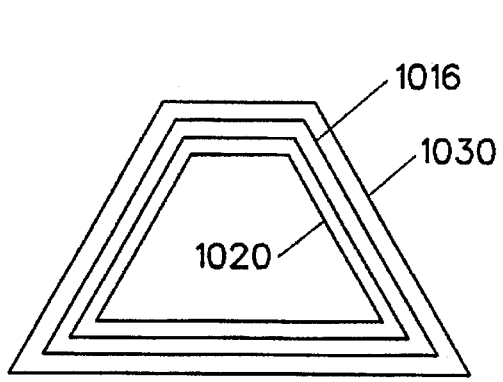
FIG. 10b is a top diagrammatic view of yet another embodiment of a bond pad, according to the present invention.

FIG. 10b shows yet another embodiment of the invention. A ring-like slit (through the ILD, not shown) is filled with conductive material 1016 forming a continuous ring around the peripheral region 1030.

Figure 10C:
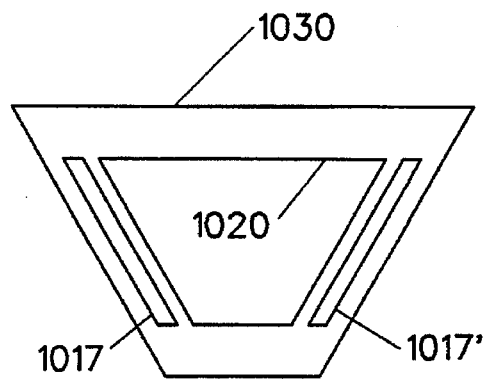
FIG. 10c is a top diagrammatic view of yet another embodiment of a bond pad, according to the present invention.

FIG. 10c shows yet another embodiment of the invention. Two elongated slits (through the ILD, not shown) are filled with conductive material 1017, 1017', on opposing sides of the peripheral region 1030.

What is claimed is:

1. A method of laying out bond pads on a semiconductor die, each bond pad having a major axis and an orientation of its major axis, comprising:

providing an array of elongated bond pads having a tapered shape, the array of elongated bond pads along a side of a semiconductor die; and arranging the orientation of the major axis of each bond pad such that the major axis aligns with an expected approach angle of a conductive line, wherein the narrower part of the tapered shape of the bond pad being toward a center area of the semiconductor die.

2. A method according to claim 1, wherein:

the side of the die is a straight edge;

the orientation of the major axes of the bond pads is such that they form a radial pattern fanning outward in a direction away from the edge of the semiconductor die; and the major axes of bond pads near a midpoint of the edge of the die have an orientation which is substantially perpendicular to the edge.

3. A method according to claim 1, further comprising:

adapting the semiconductor die to be mounted to a substrate having conductive lines approaching a die-receiving area at a range of approach angles in a radial fan out pattern, each conductive line corresponding to a particular bond pad on the die; and aligning the major axis of each bond pad with the approach angle of the corresponding conductive line.

4. A method according to claim 1, wherein:

the conductive line is a bond wire.

5. A method according to claim 1, wherein:

the conductive line is a conductive trace.

6. A method according to claim 1, further comprising:

providing a contact footprint shape;

providing an elongated tapered bond pad shape which encloses the contact footprint shape;

forming and sizing the bond pads according to the elongated tapered bond pad shape.

7. A method according to claim 6, further comprising: providing a safety zone shape around the contact footprint shape;

wherein:

the elongated bond pad shape further encloses the safety zone shape.

* * * * *